United States Patent
Evans, Jr.

(10) Patent No.: US 8,310,856 B2
(45) Date of Patent: Nov. 13, 2012

(54) FERROELECTRIC MEMORIES BASED ON ARRAYS OF AUTONOMOUS MEMORY BITS

(75) Inventor: Joseph Tate Evans, Jr., Albuquerque, NM (US)

(73) Assignee: Radiant Technology, Albuquerque, NM (US)

( * ) Notice: Subject to any disclaimer, the term of this patent is extended or adjusted under 35 U.S.C. 154(b) by 358 days.

(21) Appl. No.: 12/797,539

(22) Filed: Jun. 9, 2010

(65) Prior Publication Data

US 2011/0305061 A1    Dec. 15, 2011

(51) Int. Cl.
*G11C 11/22* (2006.01)

(52) U.S. Cl. ........................................ 365/145

(58) Field of Classification Search ............... 365/49.13, 365/65, 109, 117, 145; 257/295, E21.208, 257/E21.663, E21.664, E27.104, E29.164; 438/3
See application file for complete search history.

(56) References Cited

U.S. PATENT DOCUMENTS

| | | | |
|---|---|---|---|
| 5,898,609 | A | 4/1999 | Yoo |
| 6,172,897 | B1 | 1/2001 | Shuto |
| 2004/0061153 | A1* | 4/2004 | Misewich et al. ............ 257/295 |
| 2004/0108526 | A1* | 6/2004 | Takahashi et al. ............ 257/204 |
| 2007/0014169 | A1* | 1/2007 | Takahashi et al. ............ 365/203 |
| 2008/0068877 | A1* | 3/2008 | Takahashi et al. ............ 365/156 |
| 2009/0207642 | A1* | 8/2009 | Shimano et al. ................ 365/72 |

FOREIGN PATENT DOCUMENTS

| | | |
|---|---|---|
| JP | 2000-353380 A | 12/2000 |
| KR | 10-1999-0016845 A | 3/1999 |
| WO | 95-26570 A1 | 10/1995 |

OTHER PUBLICATIONS

International Search Report, PCT/US2011/039677 dated Feb. 17, 2012.

* cited by examiner

*Primary Examiner* — Richard Elms
*Assistant Examiner* — Harry W Byrne
(74) *Attorney, Agent, or Firm* — Calvin B. Ward (57) ABSTRACT

A memory having a plurality of ferroelectric memory cells connected between first and second bit lines is disclosed. A read circuit is also connected between the first and second bit lines. A word select circuit selects one of the ferroelectric memory cells and generates a potential on the first hit line indicative of a value stored in the selected one of the plurality of ferroelectric memory cells. Each ferroelectric memory cell includes a ferroelectric capacitor and a variable impedance element having an impedance between first and second switch terminals that is determined by a signal on a control terminal. The ferroelectric capacitor is connected between the control terminal and the first switch terminal. First and second gates connect the ferroelectric memory cell to the bit lines in response to the word select circuit selecting that ferroelectric memory cell.

15 Claims, 10 Drawing Sheets

FERROELECTRIC MEMORIES BASED ON ARRAYS OF AUTONOMOUS MEMORY BITS

BACKGROUND OF THE INVENTION

Semiconductor based non-volatile memories are useful both in terms of data storage and as an alternative to rotating disk memories. Memories based on flash EEPROM cells have found increasing applications in computers as well as consumer devices such as cameras, mp3 players, and PDAs. The cost of flash EEPROM memories has decreased to the point that such memories are being used as a replacement for disk drives in computers. Semiconductor disk drives are particularly attractive for laptop computers because they require significantly lower power, are shock resistant, and are typically faster than the conventional disk drives that are utilized in such systems.

However, these memories have a number of drawbacks. First, the cost of these memories is still an order of magnitude greater than the cost of a conventional disk drive having the same capacity. In one class of memory, one bit is stored in each memory cell. The memory cell includes an EEPROM cell and a gate that connects the EEPROM to a bit line that receives a signal indicative of the amount of charge stored on the gate of the transistor in the EEPROM. The cells are read out in a non-destructive manner; however, the time needed to read the contents of a cell is much greater than that needed to read a conventional semiconductor memory. To overcome the slow read times, a large number of cells are read in parallel. In essence, a unit of memory, analogous to a track on a conventional rotating memory, is read at once. The memory cells associated with each "track" are located on the same row of cells in the memory, which is organized as a plurality of rows and columns. Since the time to address a row is much smaller than the average time needed to position a sector under the read head of a rotating memory, these semiconductor memories have an extremely small seek time. Unfortunately, the time needed to write a memory cell limits the rate at which data can be written to the memory to times that are significantly longer than the write times for conventional high-speed disk drives.

Second, the number of write cycles that can be executed on each cell before the memory fails is significantly less than that of conventional disk drives. To overcome this problem complex storage algorithms are used to ensure that the writes are not concentrated in any particular group of cells.

Third, the cost of providing a semiconductor disk drive that has write times that are as good or better than the fastest conventional disk drives further increases the cost of the drives to the point where one drive can cost more than a conventional personal computer system. In the case of laptop computers, power considerations dictate that the conventional drives used in laptops are significantly slower than the high speed drives used in workstations. Hence, the increase in speed and reduced power considerations make semiconductor drives attractive for laptops.

Finally, flash memory is confined to silicon fabrication regimes that are not easily adapted to environments in which high energy x-rays or other high-energy radiation is present. Hence, these memories are not useful in such high radiation environments.

Ferroelectric memories are an alternative to flash-based memories and have the potential to address many of the problems described above. In one class of conventional ferroelectric memory the data is stored in the remanent polarization of one or more capacitors in each memory cell. The time to write a memory cell is much faster than the time to write a flash cell, and hence, the problems associated with slow write times in flash cells are avoided. In addition, the memory cells can be subjected to many more write cycles than flash based memory cells and can be constructed in fabrication systems that are radiation resistant since it takes many more hits to depolarize a capacitor than it takes to alter the charge on the floating gate of a flash memory cell.

The simplest ferroelectric memory has one ferroelectric capacitor and a gate transistor for connecting that capacitor to a bit line. The memory is read by applying a voltage across the capacitor and sensing the amount of charge that is released onto the bit line. If the memory bit is in one state, the polarization flips and a charge is released onto the bit line. In the other state, the polarization remains the same, and a much smaller charge appears on the bit lines. In a large memory, the cells are organized in a rectangular array of rows and columns. All of the cells in a column are connected to a bit line that terminates in circuitry that detects the charge released when a cell in that column is interrogated. This design places the sense amplifiers at a significant distance from the ferroelectric capacitors and requires that the ferroelectric capacitor drive a significant capacitance that is inherent in the bit lines. Since the amount of charge that is released is large when the dielectric in the ferroelectric capacitor state flips, the bit line circuitry presents challenges. Furthermore, the readout operation destroys the data if the cell is in the state in which the polarization flips; hence, the contents of the memory cell must be re-written each time the cell is read, which further complicates the bit line circuitry.

Many of the problems associated with these simple memory cells can be avoided by using memory designs in which active circuitry is provided in each memory cell. The local circuitry provides active gain and charge-to-voltage conversion that mitigates the problems associated with reading a small charge signal at a distance over a bit line. In addition, the rewriting of the ferroelectric capacitors in the memory cell is provided by the local circuitry, and hence, the timing issues presented by the simple one capacitor, one transistor memory cell are significantly reduced. One class of active memory cell is configured as a latch. Unfortunately, the silicon area needed to implement a conventional ferroelectric latch memory cell is much greater than that needed to implement the one capacitor, one transistor cell described above. For example, a conventional latch-based ferroelectric memory cell requires at least two ferroelectric capacitors and six transistors.

SUMMARY OF THE INVENTION

The present invention includes a memory having a plurality of ferroelectric memory cells connected between first and second bit lines. A read circuit is also connected between the first and second bit lines. A word select circuit selects one of the ferroelectric memory cells and generates a potential on the first bit line indicative of a value stored in the selected one of the plurality of ferroelectric memory cells. Each ferroelectric memory cell includes a ferroelectric capacitor characterized by first and second polarization states and a variable impedance element having an impedance between first and second switch terminals that is determined by a signal on a control terminal. The ferroelectric capacitor is connected between the control terminal and the first switch terminal. A first gate connects the first switch terminal to the bit line in response to the word select circuit selecting that ferroelectric memory cell; a second gate connects the control terminal to the second bit line in response to the word select circuit selecting that ferroelectric memory cell.

In one aspect of the invention, the read circuit includes a conductive load that is connected between a power terminal and the first bit line or between a power terminal and the first switch terminal. In another aspect of the invention, the conductive load varies in time during a period of time in which the selected ferroelectric memory cell is connected to the first and second bit lines.

In another aspect of the invention, the read circuit includes a feedback element that resets the polarization state to the first polarization state if the polarization state switches from the first state to the second state in response to being connected to the first bit line. In another aspect of the invention, the feedback circuit includes a switch that connects the second bit line to a power terminal in response to a potential on the first bit line or a power terminal to the control terminal.

In a still further aspect of the invention, a charge-to-voltage converter is connected to the second bit line.

In another aspect of the invention, the memory includes a write circuit that receives a data signal and couples predetermined potentials determined by the data signal to the first and second bit lines indicative of that data signal.

DETAILED DESCRIPTION OF THE PREFERRED EMBODIMENTS OF THE INVENTION

Figure 1A:
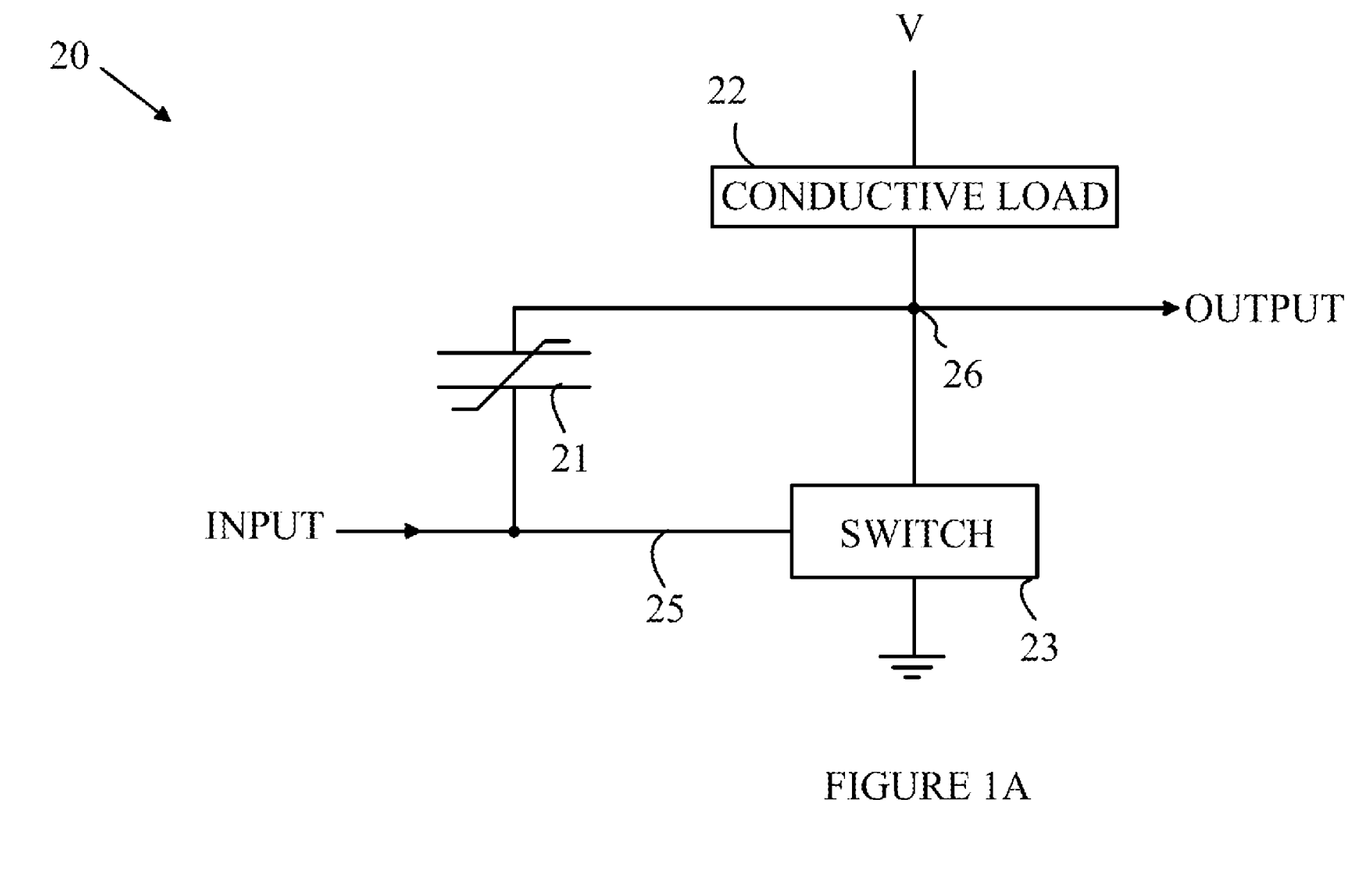
FIG. 1A is a schematic drawing of an autonomous memory circuit.

The manner in which the present invention provides its advantages can be more easily understood with reference to a novel ferroelectric latch design that is described in co-pending application U.S. Ser. No. 12/480,645, which is hereby incorporated by reference. The latch is constructed from an autonomous memory circuit and a feedback loop. Refer first to FIG. 1A, which is a schematic drawing of an autonomous memory circuit. Autonomous memory circuit 20 includes a ferroelectric capacitor 21 and a switch 23 having a current actuated control input 25. A conductive load 22 is connected between a power rail and switch 23.

Ferroelectric capacitor 21 has a remanent polarization that can be switched by applying a voltage across ferroelectric capacitor 21. That is, in the absence of a voltage across the capacitor, the dielectric of the capacitor is electrically polarized. The dielectric has two states corresponding to the dielectric being polarized either up or down. If a voltage is applied across the ferroelectric capacitor, an electric field is created in the ferroelectric capacitor. If the field direction is the same as that of the remanent polarization, a small current flows in the circuit connecting the two plates of the ferroelectric capacitor. If, on the other hand, the applied electric field is in a direction opposite to that of the remanent polarization, the remanent polarization will change direction to conform to the new field direction, and a large current will flow in the external circuit. The magnitude of the current and the voltage at which it flows can be set by adjusting the composition, area, and thickness of the ferroelectric capacitor.

Switch 23 changes from a high impedance state to a low impedance state when a current enters control input 25. In circuit 20, it is assumed that the potential of the input line to switch 23 remains at or near ground independent of the state of the switch. To simplify the following discussion, it will be assumed that the power rail is positive and that the "up" remanent polarization state is set when the positive rail potential is applied across the plates of ferroelectric capacitor 21. However, other embodiments in which the input is referenced to power and the output is referenced to ground can be utilized.

First, assume that ferroelectric capacitor 21 is polarized in the up state. When power is turned on, switch 23 is initially in the off state; hence, the potential at node 26 will increase to V. Thus, the field applied to ferroelectric capacitor 21 will also be in the up direction, and ferroelectric capacitor 21 will not flip states. Accordingly, little current will flow into the input of switch 23, switch 23 will remain off, and the output of autonomous memory circuit 20 will quickly go to the potential of V.

Next, assume that ferroelectric capacitor 21 is polarized in the down state. When power is turned on, the applied electric field across ferroelectric capacitor 21 will be opposite to that of the remanent polarization of ferroelectric capacitor 21, and ferroelectric capacitor 21 will flip states to match the applied electric field. In this case, a much larger current will flow into the control input of switch 23, and switch 23 will enter the conducting state. Node 26 will rise to an intermediate state that is less than V. The specific potential will depend on the details of the switch. This intermediate state will remain until ferroelectric capacitor 21 finishes switching to its up state. At that point there will be no more charge flowing out of ferroelectric capacitor 21, and switch 23 will again enter the non-conducting state. Hence, the potential on node 26 will then increase back to V.

Thus, after power is turned on, autonomous memory circuit 20 will have a temporary output that depends on the state of polarization of ferroelectric capacitor 21 for the period of time needed for ferroelectric capacitor 21 to switch states. If ferroelectric capacitor 21 is up when power is turned on and does not switch, the output will go high almost immediately. If ferroelectric capacitor 21 is down when power is turned on and does switch, the output will go to the intermediate state characterized by voltage Vs for the temporary period and then will go high. After that temporary time period, the output will always be high, and ferroelectric capacitor 21 will be in the up polarization state.

Figure 1B:
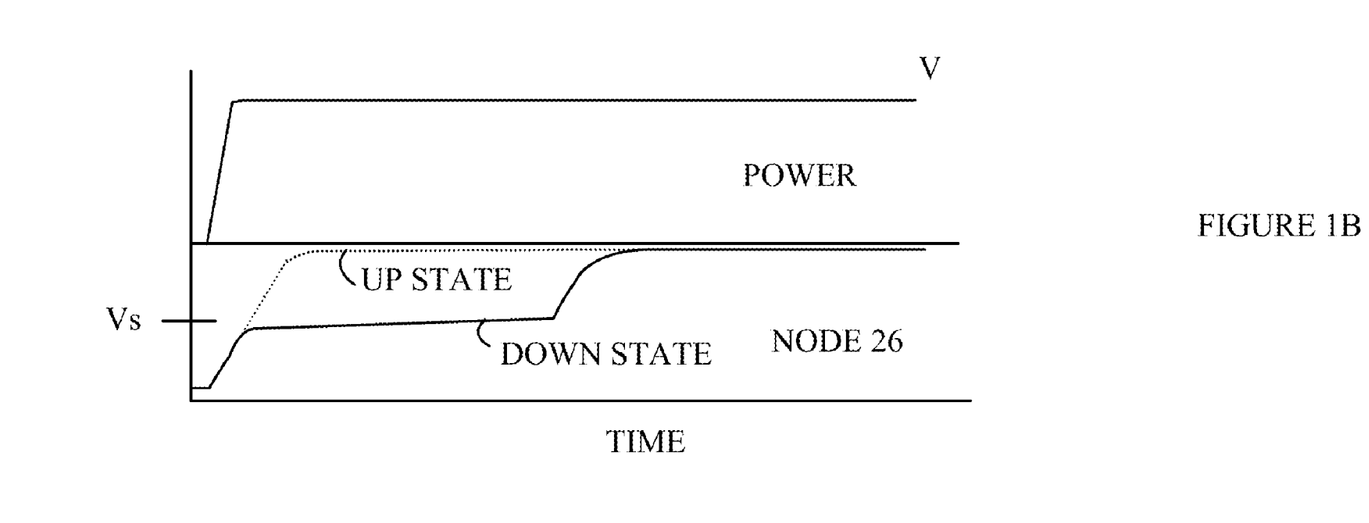
FIG. 1B illustrates the potentials in the memory circuit shown in FIG. 1A when the memory circuit is powered up.

Refer now to FIG. 1B, which illustrates the potential on the power rail and on node 26 shown in FIG. 1A as a function of time when autonomous memory circuit 20 is powered up with ferroelectric capacitor 21 in the up and down state. If ferroelectric capacitor 21 is in the down state when circuit 20 is powered up, the potential on node 26 initially increases with the power rail potential until the potential at node 26 reaches a value that causes ferroelectric capacitor 21 to begin to change polarization state. As ferroelectric capacitor 21 begins to flip polarization, charge is released that causes switch 23 to begin to conduct. If switch 23 begins to conduct too much, the potential on node 26 begins to drop and ferroelectric capacitor 21 stops switching. If switch 23 does not conduct enough, the potential on node 26 rises faster causing ferroelectric capacitor 21 to switch faster forcing more current into the control input of switch 23 increasing its conductivity. Thus, the circuit stabilizes with the potential of node 26 at a specific intermediate value with a slow rate of rise. In this manner, the change in conductivity of switch 23 limits the voltage rise at node 26 until the change in state of ferroelectric capacitor 21 is completed. At this point, no further charge will be released from ferroelectric capacitor 21, and hence, switch 23 will again become non-conducting. The potential during the transition of ferroelectric capacitor 21 will be referred to as the "shelf voltage", Vs, in the following discussion. The specific shape of the potential at node 26 will, in general, depend on the specific switch implementation.

Referring again to FIG. 1B, and in particular the dotted curve, the potential on the power rail and on node 26 shown in FIG. 1A is shown as a function of time when autonomous memory circuit 40 is powered up with ferroelectric capacitor 21 in the up state. Since ferroelectric capacitor 21 does not switch on at power up, little current flows into the control input of switch 23 and switch 23 never conducts. The potential on node 26 immediately rises to the voltage on the power rail 45.

Figure 2:
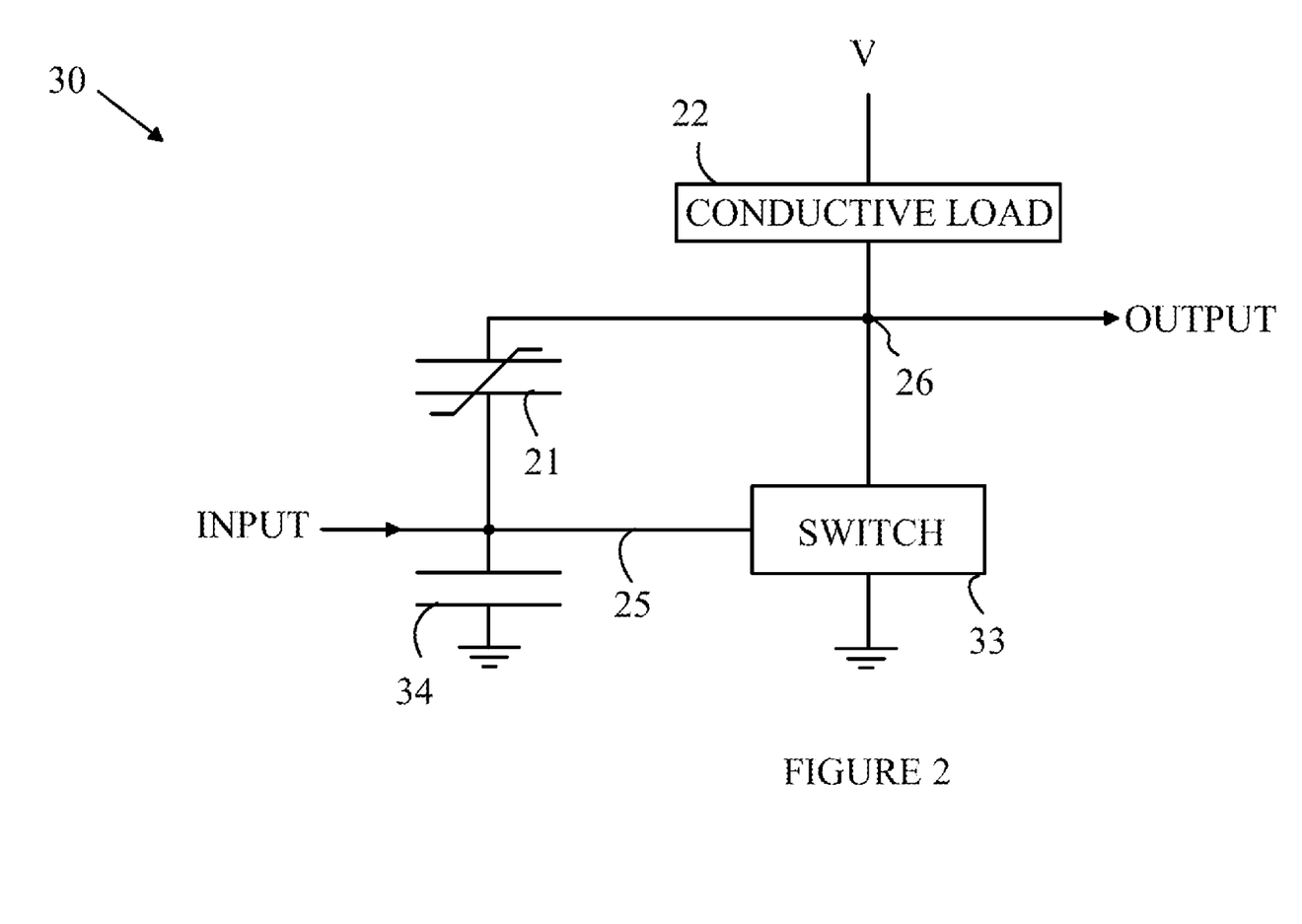
FIG. 2 is a schematic drawing of another embodiment of an autonomous memory circuit.

Refer now to FIG. 2, which is a schematic drawing of another embodiment of an autonomous memory circuit. Autonomous memory circuit 30 differs from autonomous memory circuit 20 in that switch 33 switches on a voltage signal rather than a current signal, and capacitor 34 has been added to provide a charge-to-voltage conversion. If ferroelectric capacitor 21 is in the up state when power is applied, ferroelectric capacitor 21 will remain in the up state and switch 33 will not become conductive because little charge is received by capacitor 34.

If ferroelectric capacitor 21 is in the down state when power is applied, ferroelectric capacitor 21 will start to flip its polarization as power increases. The change in polarization gives rise to a charge that is released and stored on capacitor 34, thereby raising the potential at the input to switch 33. If capacitor 34 is correctly chosen, the increase in potential on line 25 will be sufficient to cause switch 33 to conduct, thereby lowering the potential on node 26. Node 26 will remain at an intermediate potential between ground and V as long as ferroelectric capacitor 21 is changing state. Once ferroelectric capacitor 21 changes state completely, no additional charge will be stored on capacitor 34. The charge on capacitor 34 will then leak off at a rate determined by the leakage current in switch 33. At this point, switch 33 will again become non-conducting, and node 26 will rise to V. Hence, autonomous memory circuit 30 behaves in a manner analogous to autonomous memory circuit 20 discussed above. That is, during power up, the output signal can be monitored to determine the state of ferroelectric capacitor 21 prior to power up. After power up has been completed, the output will be high and ferroelectric capacitor 21 will be in the up state.

Figure 3:
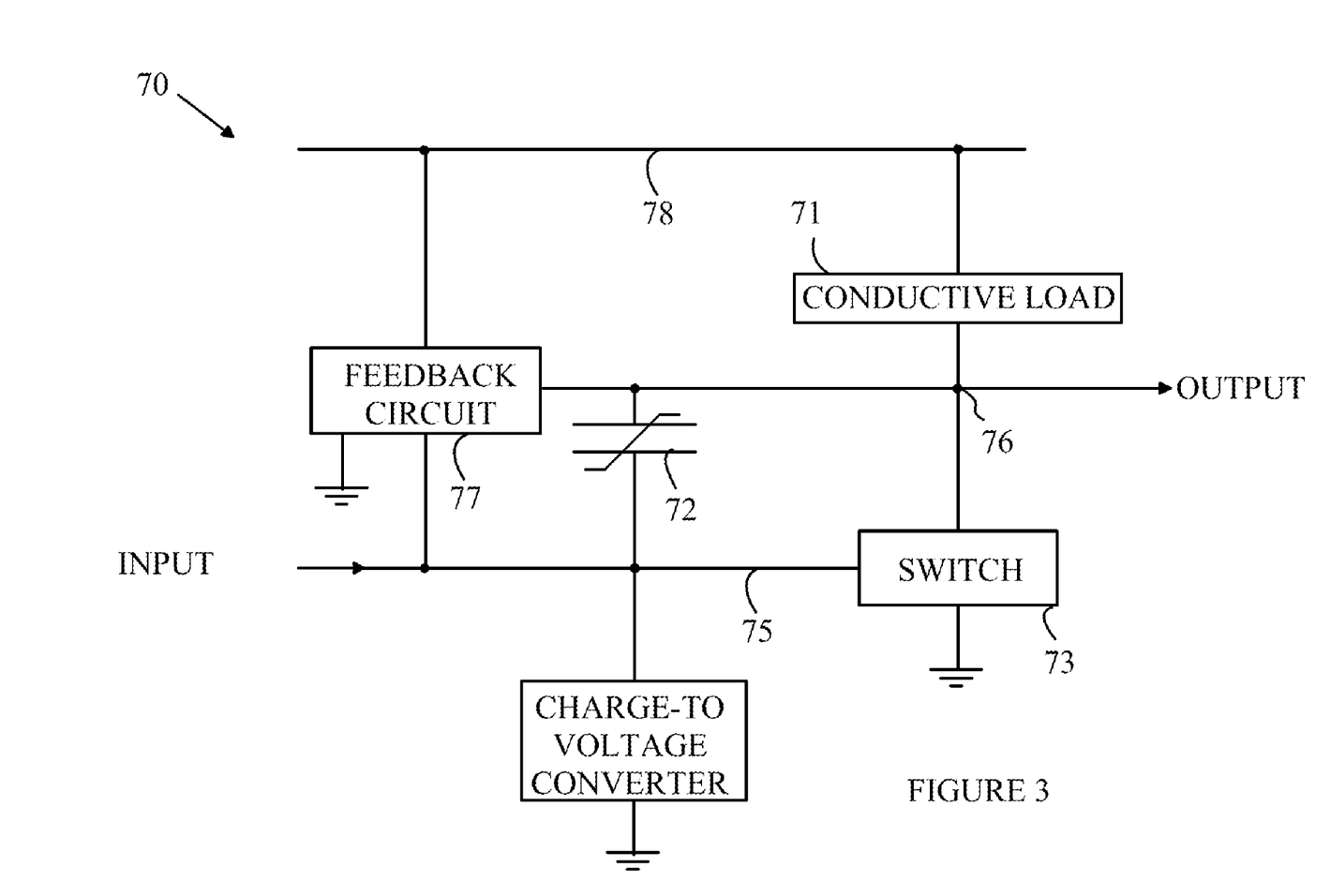
FIG. 3 is a block diagram of a non-volatile latch that is constructed utilizing a feedback path.

The autonomous memory circuit described above can be combined with a feedback path to construct a non-volatile latch. Refer now to FIG. 3, which is a block diagram of a non-volatile latch 70 that utilizes such a feedback path. Feedback circuit 77 in latch 70 measures the difference in potential between node 76 and power rail 78 as the autonomous memory circuit powers up. If the potential difference across load 71 is greater than a predetermined threshold value, feedback circuit 77 generates a signal on line 75 that causes switch 73 to enter the conducting state and ferroelectric capacitor 72 to set to the down state. With switch 73 on, the control input for feedback circuit 77 is held permanently on and the circuit latches.

Figure 4:
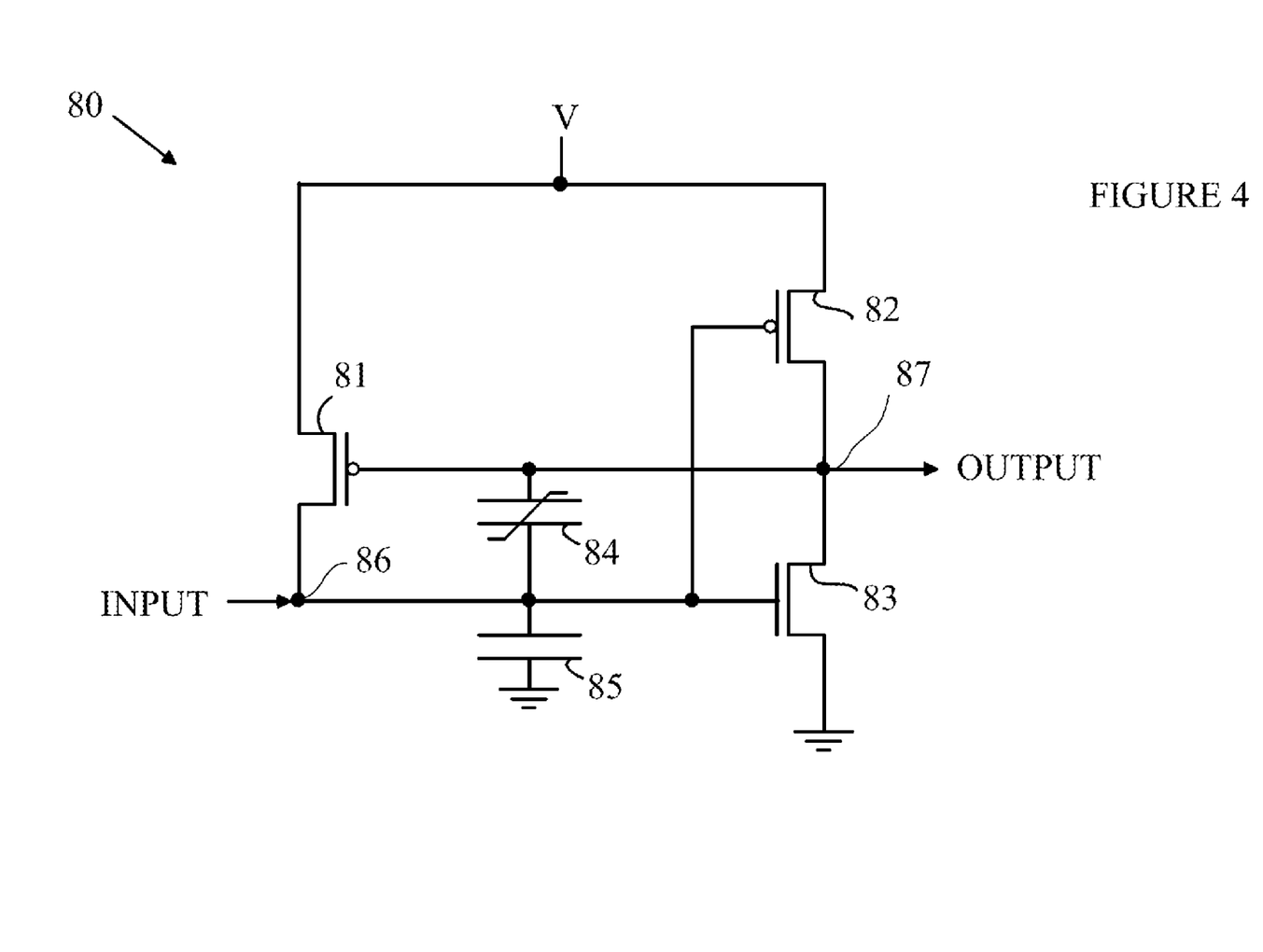
FIG. 4 is a schematic drawing of one embodiment of a non-volatile latch that utilizes FETs.

Refer now to FIG. 4, which is a schematic drawing of one embodiment of a non-volatile latch 80 that utilizes FETs. Transistor 82 acts as the conducting load in latch 80. During power up, the potential on the gate of transistor 81 will either be V or Vs, where Vs is the reduced voltage that is present on node 87 during the time ferroelectric capacitor 84 is changing polarization states. If the potential is V, transistor 81 stays totally OFF, and hence, transistor 81 provides a high impedance. In this case, transistor 81 never turns ON and transistor 83 stays OFF. OUTPUT goes high and ferroelectric capacitor 84 remains programmed in the UP state.

If the Vs is generated at node 87, transistor 81 is subjected to a negative potential between the drain and gate that is sufficient to turn transistor 81 on, and hence, transistor 81 provides a very low impedance if the shelf voltage is generated at node 87. If transistor 81 turns on, transistor 83 turns on, pulling node 86 to V and node 87 to ground, and hence, applying all of V to ferroelectric capacitor 84 to switch ferroelectric capacitor 84 back to the DOWN state. Latch 80 can be programmed while latch 80 is powered by pulling node 87 to ground to turn on transistor 81 or pulling node 86 to ground to turn off transistor 81.

The threshold criteria described above is met by designing the circuit so that the difference between the shelf voltage, Vs, and V is greater than the threshold voltage of transistor 81. The charge-to-voltage conversion function is provided by capacitor 85.

Figure 5:
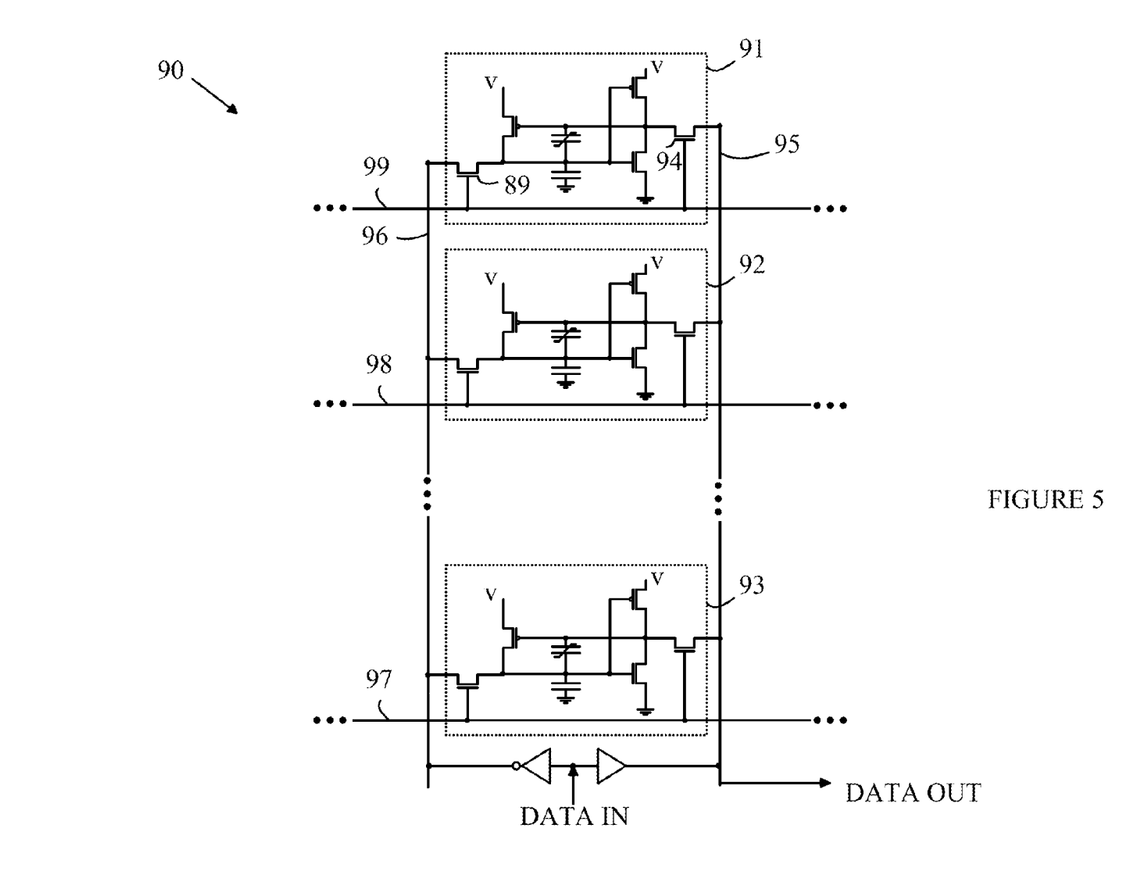
FIG. 5 illustrates one column of a memory constructed from a plurality of latch cells of the type shown in FIG. 4.

The basic latch shown in FIG. 4 can be utilized to construct a memory array. Refer now to FIG. 5, which illustrates one column of a memory 90 constructed from a plurality of latch cells of the type shown in FIG. 4. Memory 90 is organized as a plurality of rows and columns of latch cells. All of the latch cells in any given column are connected to two vertical conductors 95 and 96 by gates. For example, gate 94 connects latch 91 to conductor 95, which will be referred to as the bit line in the following discussion. Gate 89 connects latch 91 to conductor 96, which will be referred to as W' in the following discussion. The gates of all of the latches in any given row are controlled by signals on row select lines. The row select lines corresponding to latches 91-93 are shown at 97-99, respectively. A latch is written by applying the data value on the bit line and the inverse value on W'. The data stored in a selected latch is available on the bit line.

Memory 90 is an improvement over conventional ferroelectric memories based on arrays of latches in that memory 90 only requires 5 transistors and one ferroelectric capacitor per bit. Memory 90 also requires one sense capacitor per bit. To meet the design criteria discussed above with reference to FIG. 4, the size of sense capacitor 85 that performs the charge-to-voltage conversion in each latch is typically significantly larger than capacitor 84 that stores the data, and hence, a significant area is required for that capacitor. Accordingly, embodiments in which capacitor 85 is not required in each memory cell would be advantageous.

Refer again to FIG. 4. An embodiment of the invention that requires significantly fewer transistors and space for the sense capacitors is based on the observation that transistor 82, which provides the conductive load, transistor 81 that provides the feedback loop during programming and reading of the data, and capacitor 85 are only required when the latch is selected for reading and writing. Accordingly, these components can be moved out of the individual latches and shared by all of the latches in a column.

Figure 6:
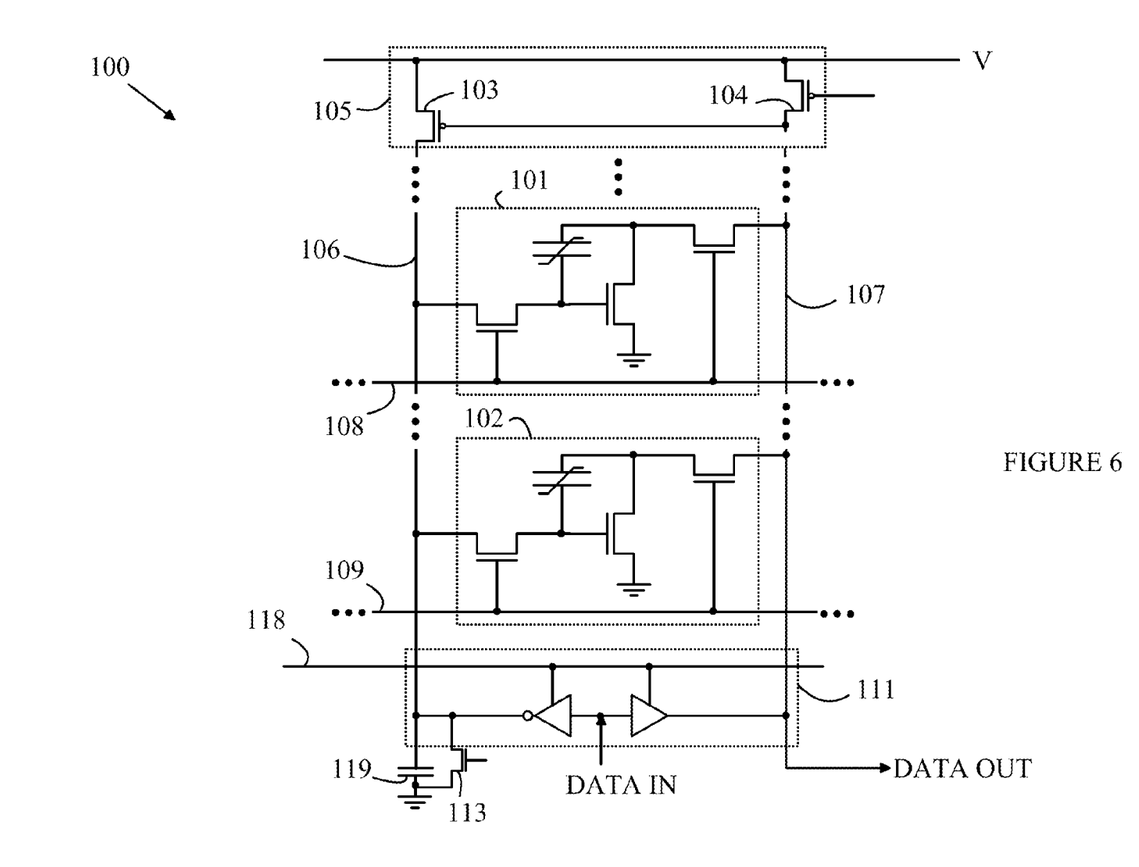
FIG. 6 illustrates one column of a memory according to another, embodiment of the present invention.

Refer now to FIG. 6, which illustrates one column of a memory 100 according to another embodiment of the present invention. While only one column of the memory is shown, it is to be understood that memory 100 has a plurality of such columns. Memory 100 is constructed from a plurality of memory cells such as memory cells 101 and 102 that are arranged in a rectangular array of rows and columns. Exemplary memory cells are shown at 101 and 102. Each memory cell in a column is connected to a bit line such as bit line 107 and a W' such as W' line 106 which serve functions analogous to those described above with reference to memory 90. Each memory cell in a given row is connected to a row select line that is used to select the memory cells of that row for reading and writing. Exemplary row select lines are shown at 108 and 109.

The memory cells in each column share a read-write circuit 105 that includes a feedback transistor 103 and a load transistor 104. As noted above, these transistors are only required when a memory cell is being accessed during a read and write operation. Similarly, a shared charge-to-voltage converter in the form of capacitor 119 is connected to the W' line in each column. A memory cell is written by providing the data to write circuit 111, enabling the write select line 118, and selecting the desired cell by activating the row select line for that cell. Similarly, when a row select line is activated, the data in the selected memory cell appears on the bit line corresponding to the column in which that memory cell is located.

It should be noted that each memory cell requires only three transistors and one ferroelectric capacitor. Hence, memory 100 provides a significant improvement over conventional ferroelectric latch memories both in the number of transistors and the number of ferroelectric capacitors required.

To shorten the time between write cycles, a discharge switch 113 can be provided across capacitor 119. Switch 113 is closed after the data has been successfully written. In the absence of switch 119 the discharge time is determined by the leakage resistance to ground on line 116. Sense capacitor 119 may be incorporated intrinsically as the parasitic capacitance of W' line 106 if the column, and hence W', are long enough.

Figure 7:
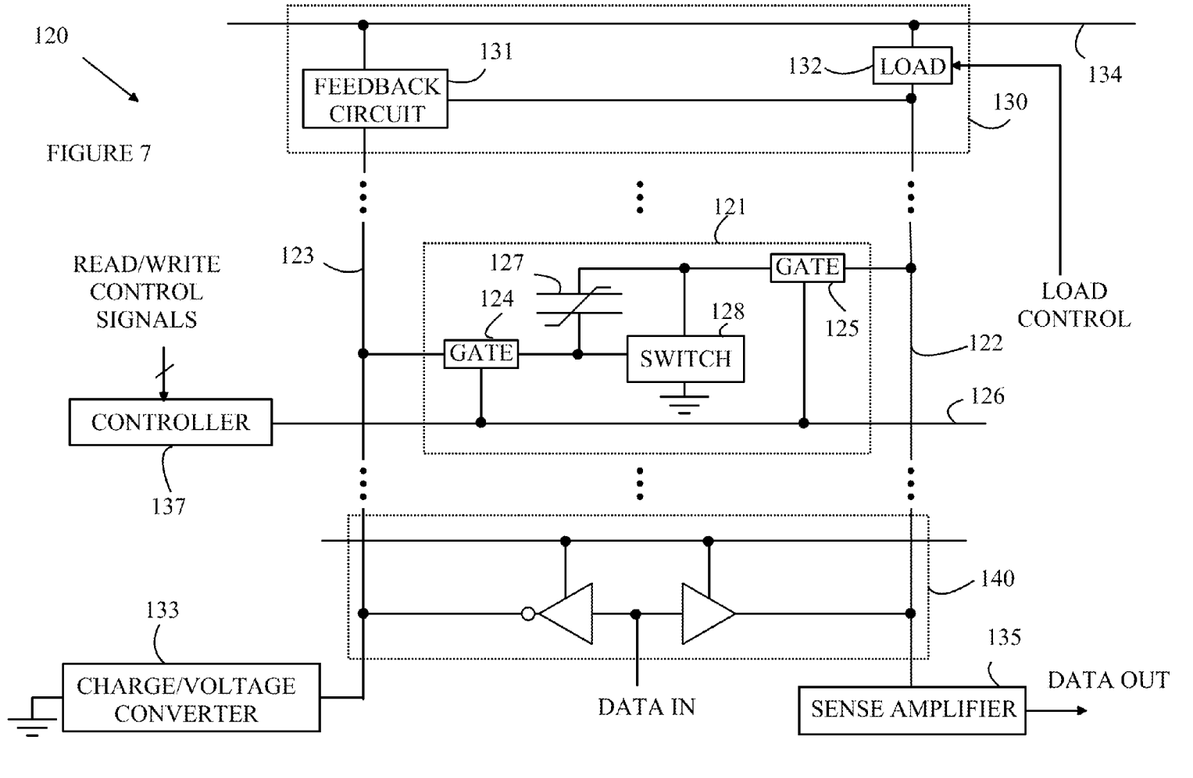
FIG. 7 is a more generalized embodiment of a memory according to one embodiment of the present invention.

The above-described embodiments utilize FETs for the switches, gates, feedback circuit, and load; however, embodiments based on other elements can also be constructed. Refer now to FIG. 7, which is a more generalized embodiment of a memory according to one embodiment of the present invention. Memory 120 includes a plurality of memory cells 121 organized as a plurality of rows and columns of memory cells. To simplify the drawing, only one column is shown in the drawing. Each memory cell in a column is connected to a bit line 122 and a W' line 123 that serve functions analogous to those described above with respect to the embodiments shown in FIG. 6.

Each memory cell is connected to the bit line and W' associated with the column in which that memory cell is located by gates 124 and 125 which are placed either in a conducting state or a non-conducting state by a signal on a row select line 126 that is coupled to each memory cell on a given row. When gates 124 and 125 in a selected memory cell are in a conductive state, ferroelectric capacitor 127 in that memory cell is connected between bit line 122 and W' line 123. When gates 124 and 125 are not in a conductive state, ferroelectric capacitor 127 is isolated from bit line 122 and W' line 123. Each memory cell also includes a switch 128 that provides a variable impedance between one terminal of ferroelectric capacitor 127 and ground in response to charge moving between the plates of ferroelectric capacitor 127 when the state of polarization of ferroelectric capacitor 127 changes.

Each column includes a read-write circuit 130 that contains the feedback circuit 131, load 132, and charge-to-voltage converter 133 needed during the reading and writing of the selected cell in the column. These components are shared by the various memory cells in each column. Each column also includes a write circuit 140 that couples a value that is to be written into a selected memory cell onto bit line 122 and the complement of that value onto W' line 123.

In the embodiment shown in FIG. 7, it is assumed that the switches shown at 128 are voltage-controlled switches. However, embodiments in which these switches are current-controlled can also be constructed. It should be noted that charge-to-voltage converter 133 is not needed if switch 128 is a current-controlled switch instead of a voltage-controlled switch.

Since the column components are shared by all of the cells in a column, the issues with respect to the size of the capacitor used in the charge-to-voltage converter are significantly reduced. The size of the capacitor can also be reduced by using a capacitor with a ferroelectric dielectric that does not have a remnant polarization, since such dielectrics have much higher dielectric constants. In addition, other forms of charge-to-voltage converters that utilize active components to set the charge-to-voltage dependent output voltage can be utilized. For example, a small capacitor on the gate of a transistor can provide the conversion. In addition, a Zener diode or stack of conventional diodes could be utilized.

The conductive load can be a constant current source or a resistive load or any other element that causes the voltage on bit line 122 to vary as a function of the impedance of switch 128 when that switch is connected to the bit line via gate 125. In the simplest case, the impedance of load 132 is fixed. Load 132 can be a constant current source or a resistive load that is implemented as a fixed resistor or other device that presents a fixed resistive load.

In other embodiments, the impedance of load 132 can be varied over the course of a read/write cycle. Consider the case of a read cycle. The output voltage on the bit line will either be substantially the same as that on power rail 134 or a lower voltage Vs. In the later case, Vs will be present for a time interval corresponding to the time needed for the polarization of ferroelectric capacitor 127 to complete a state change. This time is governed by an RC time constant that depends on the impedance of load 132. The impedance of load 132 also determines the difference between V and Vs that must be sensed by the output circuitry 135 that is connected to bit line 122. Increasing the impedance of load 132 leads to larger differences between V and Vs. In addition, increasing the impedance of load 132 results in Vs being present for a longer period of time. As a result, the cycle time for reading and writing is increased if the impedance is increased. Hence, there is a tradeoff between the complexity of sense amplifier 135 and the readout cycle time if the impedance of load 132 is constant during the read/write cycle.

If, however, the impedance of load 132 is varied during the read cycle, the advantages of a larger difference in V and Vs can be achieved without substantially increasing the read cycle time. In such embodiments, the impedance of load 132 is initially set to a high value to increase the difference between V and Vs. After a period of time that is sufficient for sense amplifier 135 to capture the data on bit line 122, the impedance of load 132 is reduced if switch 128 is off or increased if switch 128 is on to allow the read cycle to be completed and the correct data value to be latched back into ferroelectric capacitor 127.

The impedance of load 132 can also be varied between read and write cycles. When data is being written to a memory cell, the power needed to program ferroelectric capacitor 127 is supplied by write circuit 140. Hence, the impedance of load 132 should be set to a high value to isolate ferroelectric capacitor 127 from power bus 134 during the write cycle or set low to speed up the write operation or provide low output impedance once the latch state has been established.

In the case of a resistive element, exemplary embodiments for conductive load 132 include a fixed resistor, a transistor, a ferroelectric field effect transistor, a plurality of resistors and a switch for selecting one of the resistors in response to the load control circuit. In the case of a current source, load 132 can be implemented with a transistor or any circuit providing a fixed or controllable current. However, circuits requiring less area on a chip are preferred, since there is one such circuit per column of pixels Switch 128 can be implemented with any element or arrangement of elements that provides an impedance between first and second terminals that varies as a function of the potential on a control terminal. Exemplary embodiments of switch 128 include transistors, both bi-polar and field effect, ferroelectric field effect transistors, relays, or circuits constructed from a plurality of such elements. Ferroelectric FETs are known to the art, and hence, will not be discussed in detail here. The reader is directed to U.S. Pat. No. 5,070,385 for a more detailed description of these devices. A ferroelectric FET can be fabricated in the same fabrication system as ferroelectric capacitor 127 allowing them to be built simultaneously at reduced cost. It should also be noted that the ferroelectric devices do not require a crystalline substrate such as a silicon wafer. The devices can be fabricated on any substrate that can withstand the fabrication temperatures, and hence, the entire circuit can be fabricated on a non-crystalline substrate, which substantially reduces the cost of fabrication. Since size is an important factor in many memories, switches based on single devices are preferred in such memories.

Feedback circuit 131 can be implemented with any circuit that connects W' line 123 to power rail 134 when the potential on bit line 122 drops to Vs. Exemplary embodiments of feedback circuit 131 include transistors, both bi-polar and field effect, ferroelectric field effect transistors, relays, or circuits constructed from a plurality of such elements.

The various control functions such as row selection and read/write control signals such as the load control signal are implemented by controller 137 in response to control signals that are provided by a source that is external to memory 120. The specific functions implemented depend on the selection of circuit components. To simplify the drawing, the connections between controller 137 and many of the components that receive control signals from controller 137 have been omitted.

It should be noted that the embodiment shown in FIG. 7 can also be used to provide a memory in which the bits are not latched by removing feedback circuit 131. In such a memory, the re-writes of the data are done in a separate operation. In such a memory, the autonomous bits are all set to a predetermined state. Data is then written into the bits by altering the states of the bits that store values with the opposite memory state. The data can then be readout once, which restores the memory to the erased state. This configuration is useful in holding one-time data in a communication node or sensor system.

It should be noted that the memory cycle time can be reduced by performing the latching function in parallel with the data being readout. Once sense amplifier 135 has made the distinction between V and Vs to determine the state to be output, the latching function implemented by elements 132 and 133 can be done in parallel with the readout.

In one embodiment, a readout cycle is performed as follows. First, gates 124 and 125 are placed in a conductive state for the row in question. Power is then applied to line 134 and the data is latched by feedback circuit 131. Sense amplifier 135 then detects the voltage on bit line 122. Sense amplifier 135 then outputs the read data. To reduce errors in the states of the capacitors that are not being selected, gates 124 and 125 should be turned off prior to grounding the bit lines, while sense amplifier 135 is outputting the data.

It should be noted that embodiments in which the latching operation is performed after sense amplifier 135 detects the state of bit line 122 could also be implemented to further reduce the cycle time.

Figure 8:
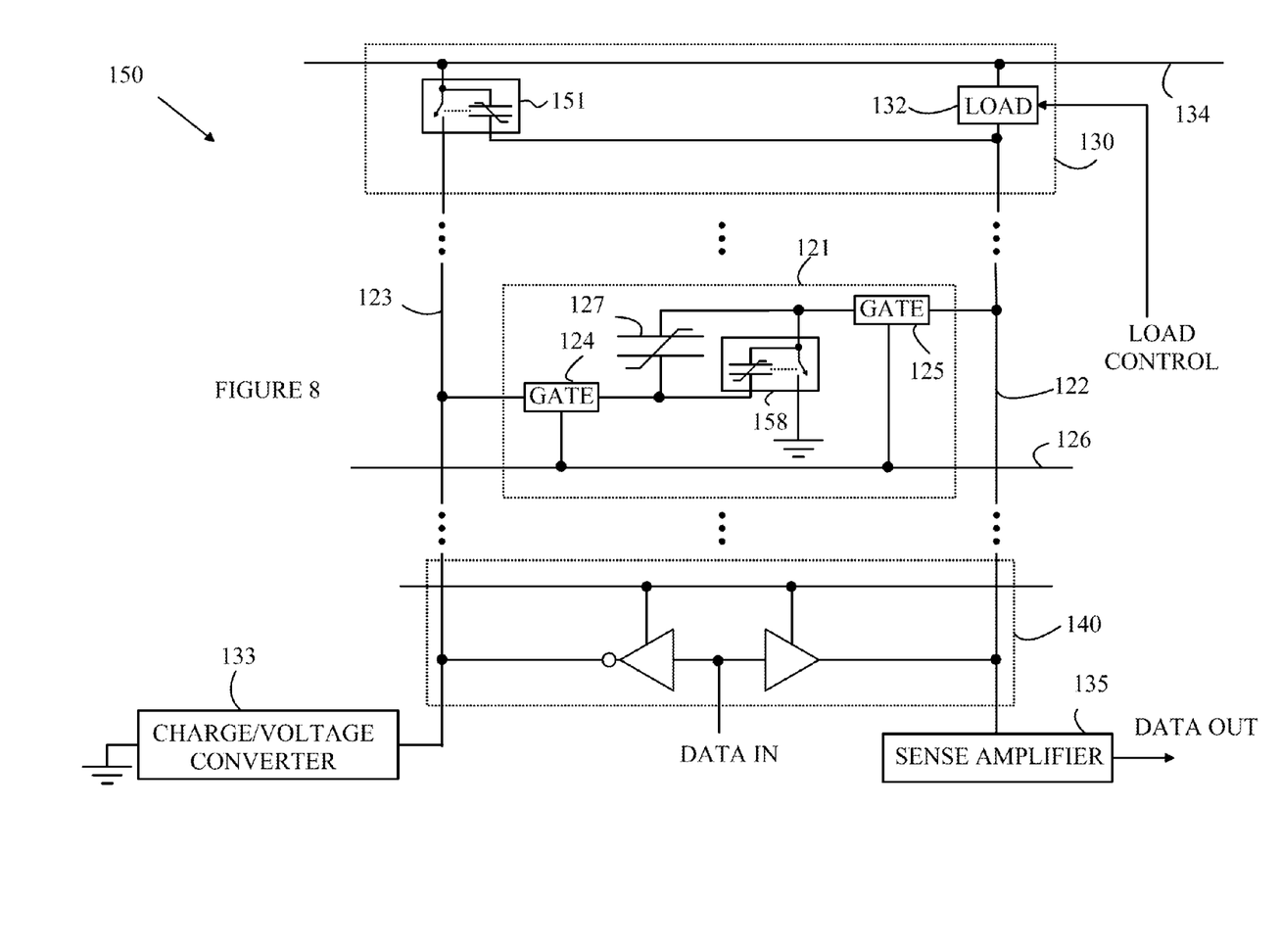
FIGS. 8 and 9 illustrate an embodiment of the present invention that utilizes ferroelectric relays for switches in each memory cell and the feedback circuit.
Figure 9:
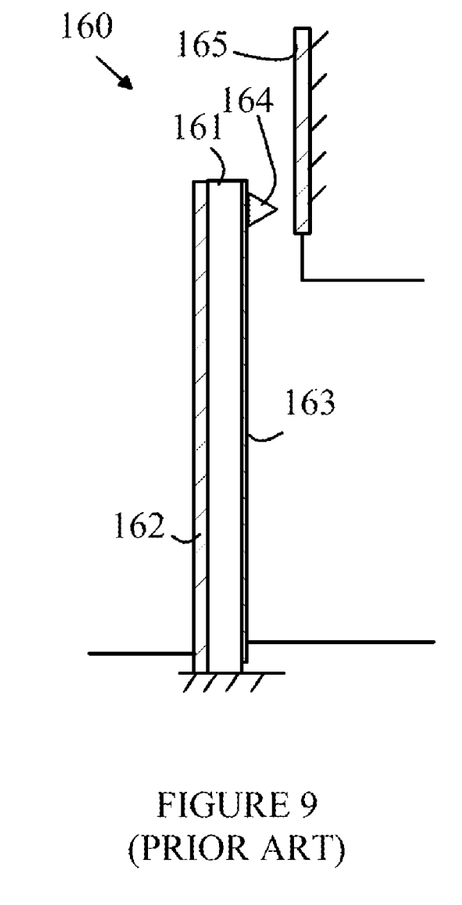

As noted above, the switches and feedback circuit could be implemented as relays. Refer now to FIGS. 8 and 9, which illustrate an embodiment of the present invention that utilizes ferroelectric relays for switches in each memory cell and the feedback circuit. Memory 150 is similar to memory 120 in operation. To simplify the drawing, those elements that serve the same functions as elements in memory 120 have been given the same numeric designations. Memory 150 uses a ferroelectric relay 151 to implement feedback circuit 131 shown in FIG. 7. Ferroelectric relays 158 are also used to implement switches 128 shown in FIG. 7. It should also be noted that ferroelectric relays could also be used to implement gates 124 and 125.

Ferroelectric relays are well known in the art, and hence, these relays will not be discussed in detail here. For the purposes of the present discussion, an exemplary ferroelectric relay is shown in FIG. 8; however, many other embodiments of such relays could be utilized in the present invention. Ferroelectric relay 160 in FIG. 9 is constructed from a layer of ferroelectric material 161 that is sandwiched between two electrodes 162 and 163. For the purpose of this example, it will be assumed that electrode 162 cannot significantly change its length in response to a change in length of layer 161, and hence, when layer 161 changes in length, electrode 162 bends such that contact 164 moves toward electrode 165 or away therefrom depending on the whether layer 161 increases or decreases in length. Layer 161 is polarized such that contact 164 will contact electrode 165 when a potential is applied between electrodes 162 and 163 due to the length of layer 161 becoming shorter in response to the applied electric field. When no potential is applied between the electrodes, contact between contact 164 and electrode 165 is broken.

The above-described embodiments of the present invention utilize one read/write circuit per column of memory cells. However, embodiments in which the read/write circuitry is shared by all of the columns can also be constructed. Since the bit line is actively driven in the cells, and timing is not critical, a single read/write circuit can be utilized for all of the cells. In such embodiments, the bit line and W' line in each column terminate on pass-gates that selectively connect one column at a time to the read/write circuitry. Such embodiments require significantly smaller dies and require substantially less power.

The above-described Summary of the Invention and embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A memory comprising:
   first and second bit lines; and
   a plurality of ferroelectric memory cells connected between said first and second bit lines;
   a word select circuit that selects one of said ferroelectric memory cells,
   a read circuit that generates a potential on said first bit line indicative of a value stored in said selected one of said plurality of ferroelectric memory cells,
   each ferroelectric memory cell comprising;
   a ferroelectric capacitor characterized by first and second polarization states;
   a variable impedance element having an impedance between first and second switch terminals that is determined by a signal on a control terminal, said ferroelectric capacitor being connected between said control terminal and said first switch terminal;
   a first gate that connects said first switch terminal to said bit line in response to said word select circuit selecting that ferroelectric memory cell; and
   a second gate that connects said control terminal to said second bit line in response to said word select circuit selecting that ferroelectric memory cell.

2. The memory of claim 1 wherein said read circuit comprises a conductive load that is connected between a power terminal and said first bit line.

3. The memory of claim 1 wherein said read circuit comprises a conductive load connected between a power terminal and said first switch terminal.

4. The memory of claim 2 wherein said conductive load varies in time during a period of time in which said selected ferroelectric memory cell is connected to said first and second bit lines.

5. The memory of claim 1 wherein said read circuit further comprises a feedback element that resets said polarization state to said first polarization state if said polarization state switches from said first state to said second state in response to being connected to said first bit line.

6. The memory of claim 5 wherein said feedback circuit comprises a switch that connects said second bit line to a power terminal in response to a potential on said first bit line.

7. The memory of claim 5 wherein said feedback circuit comprises a switch that connects a power terminal to said control terminal.

8. The memory of claim 1 further comprising a charge-to-voltage converter connected to said second bit line.

9. The memory of claim 8 wherein said charge-to-voltage converter comprises a capacitor having a ferroelectric dielectric.

10. The memory of claim 1 further comprising a write circuit that receives a data signal and couples predetermined potentials determined by said data signal to said first and second bit lines.

11. The memory of claim 1 wherein said switch in one of said ferroelectric memory cells comprises a bi-polar transistor, a field effect transistor, a ferroelectric field effect transistor, a relay, or circuits constructed from a plurality of such elements.

12. A method for reading data from a memory comprising a plurality of ferroelectric memory cells that are reversibly connectable to first and second bit lines, each ferroelectric memory cell comprising:
   a ferroelectric capacitor characterized by first and second polarization states;
   a variable impedance element having an impedance between first and second switch terminals that is determined by a signal on a control terminal, said ferroelectric capacitor being connected between said control terminal and said first switch terminal;
   a first gate that connects said first switch terminal to said bit line in response to said word select circuit selecting that ferroelectric memory cell; and
   a second gate that connects said control terminal to said second bit line in response to said word select circuit selecting that ferroelectric memory cell, said method comprising the steps of:
   (a) connecting one of said ferroelectric memory cells between first and second bit lines while leaving the remaining ferroelectric memory cells disconnected from said first and second bit lines;
   (b) applying power to said connected ferroelectric memory cells after said ferroelectric memory cells has been connected to said first and second bit lines;
   (c) sensing a state for said ferroelectric memory cells by measuring a signal on one of said bit lines;
   (d) outputting a signal indicative of said state on an output line;
   (e) disconnecting said ferroelectric memory cell from said bit lines; and
   (f) removing power from said bit lines.

13. The method of claim 12 wherein steps (e) and (f) are performed in parallel with step (d).

14. The method of claim 12 wherein said ferroelectric capacitor is in a first state when said ferroelectric memory cell is connected to said bit lines and wherein said method further comprising the step of (d1) causing said ferroelectric capacitor in said connected ferroelectric memory cell to be reset to first state prior to removing power from said bit lines.

15. The method of claim 14 wherein steps (d1), (e), and (f) are performed in parallel with step (d).

* * * * *